(12) United States Patent
Hwang et al.

(10) Patent No.: US 8,350,568 B2
(45) Date of Patent: Jan. 8, 2013

(54) NUCLEAR MAGNETIC RESONANCE APPARATUS

(75) Inventors: Seong-min Hwang, Daejeon (KR); Kiwoong Kim, Daejeon (KR); Jin-Mok Kim, Daejeon (KR); Yong-Ho Lee, Daejeon (KR); Chan Seok Kang, Daejeon (KR); Kwon Kyu Yu, Daejeon (KR); Seong-Joo Lee, Chuncheon-si (KR)

(73) Assignee: Korea Research Institute of Standards and Science, Daejeon (KR)

( * ) Notice: Subject to any disclaimer, the term of this patent is extended or adjusted under 35 U.S.C. 154(b) by 599 days.

(21) Appl. No.: 12/582,370

(22) Filed: Oct. 20, 2009

(65) Prior Publication Data

US 2011/0068789 A1    Mar. 24, 2011

(30) Foreign Application Priority Data

Sep. 21, 2009 (KR) .................. 10-2009-0089089

(51) Int. Cl.
*G01V 3/00* (2006.01)

(52) U.S. Cl. ...................................... 324/318; 324/322

(58) Field of Classification Search .................. 324/318, 324/322, 307, 300
See application file for complete search history.

(56) References Cited

U.S. PATENT DOCUMENTS

| 7,053,610 | B2 * | 5/2006 | Clarke et al. .................. 324/300 |
| 7,187,169 | B2 * | 3/2007 | Clarke et al. .................. 324/307 |
| 8,179,135 | B2 * | 5/2012 | Hahn et al. ..................... 324/307 |

FOREIGN PATENT DOCUMENTS

| JP | 07-321382 A | 12/1995 |
| JP | 2002-076453 A | 3/2002 |
| KR | 10-2005-0063232 A | 6/2005 |

* cited by examiner

*Primary Examiner* — Louis Arana
(74) *Attorney, Agent, or Firm* — Jenkins, Wilson, Taylor & Hunt, P.A.

(57) ABSTRACT

A nuclear magnetic resonance apparatus includes a dewar containing a low-temperature liquid refrigerant, a prepolarization coil disposed inside the dewar and including a superconducting wire, a prepolarization coil driving unit for intermittent application of current to the prepolarization coil in a capacitor charge/discharge method to generate a prepolarization magnetic field, a sensor unit for measuring a nuclear magnetic resonance signal from a sample to which a prepolarization magnetic field is applied with the prepolarization coil, and a readout magnetic field generation unit for applying a readout magnetic field to the sample.

17 Claims, 12 Drawing Sheets

NUCLEAR MAGNETIC RESONANCE APPARATUS

CROSS-REFERENCE TO RELATED APPLICATIONS

This U.S. non-provisional patent application claims priority under 35 U.S.C. §119 to Korean Patent Application No. 10-2009-0089089, filed on Sep. 21, 2009, the entirety of which is hereby incorporated by reference.

BACKGROUND

1. Technical Field

The present invention relates to nuclear magnetic resonance apparatuses and, more specifically, to low magnetic field nuclear magnetic resonance apparatuses.

2. Description of Related Art

Nuclear magnetic resonance (NMR) is a phenomenon involved with precession of the magnetic spin of an atomic nucleus arising from resonance of the magnetic spin of the nucleus under a magnetic field when the magnetic field is applied to the atomic nucleus. Magnetic resonance imaging (MRI) is a non-invasive technique of imaging the inner part of an imaging sample. The MRI is widely used as a medical diagnostics tool to image the inner part of human body.

The main magnet in a conventional NMR/MRI is required to have a highly uniform magnetic field of as small as 0.1 and as large as several Tesla (T). Therefore, the main magnet generating the magnetic field is large in volume and high in cost.

Low magnetic field NMR/MRI divides the magnetic field generated from the main magnet of a conventional NMR/MRI into two components: a prepolarization magnetic field and a readout magnetic field. This way, the readout magnetic field may operate while reducing its intensity from tens of microTesla (uT) to several uT.

Low magnetic field NMR/MRI includes a prepolarization coil for generating the prepolarization magnetic field and a readout coil for generating the readout magnetic field. The prepolarization coil-generated magnetic field magnetizes, or prepolarize, the imaging sample. The readout magnetic field is then applied to the imaging sample after complete removal of the prepolarization magnetic field, allowing a readout device to measure the magnetic resonance signal before the magnetization of the imaging target is relaxed off. Thus, the prepolarization coil has only to generate a strong prepolarization magnetic field with significantly relaxed uniformity requirement compared to that of the main magnet of the conventional NMR/MRI systems. Moreover, while the readout coil need to provide a uniform magnetic field, it needs only to generate a weak magnetic field, it may be simple in structure and low in cost. As the intensity of the readout magnetic field is reduced, the readout signal frequency corresponding to Larmor frequency proportional to the intensity of the magnetic field is reduced from several kilohertz (kHz) to hundreds of hertz (Hz).

Therefore, it is possible to measure phenomena not previously measurable with conventional high magnetic field NMR/MRI. For example, low magnetic field NMR/MRI is able to dramatically reduce distortion in the image resulting from the presence of metal inside of or adjacent to the imaging sample. Hence the low magnetic field NMR/MRI may be reasonably applied to a person with metal prostheses. Likewise, low magnetic field NMR/MRI may be able to non-invasively obtain images from inside metal cans. In this way, low magnetic field NMR/MRI may operate as an apparatus for determination or identification of physical properties of an imaging sample in addition to conventional security screening devices using X-ray. With relaxed requirement for the uniformity of the prepolarization magnetic field, low magnetic field NMR/MRI is not limited to the shape of hollow cylinder around the imaging sample and is able to adopt an open design, for example, it may adopt more flexible shapes, like thick cake shape, to place an imaging sample below.

A conventional power MOSFET device is the usual choice for controlling the electric current from a power supply to provide intermittent current to the prepolarization coil. When the power MOSFET device turns the current off, magnetic induction energy from the current already flowing through the prepolarization coil is dissipated at the power MOSFET device as heat through avalanche breakdown-induced resistive heating. This simple method may be able to constitute the driving circuit of the prepolarization coil. However, this method suffers from high energy loss since the magnetic induction energy in the prepolarization coil is dissipated as heat for every prepolarization period. Also, when the power MOSFET device turns on and the current is applied to the prepolarization coil, rising time of the current may depend on the relaxation time constant of an L-R circuit formed by the prepolarization coil and the driving circuit. Due to the characteristics of the prepolarization coil which must generate a strong magnetic field using the current provided by the driving circuit, the prepolarization coil needs a high inductance value ($L_p$), in the order of hundreds of millihenry (mH). Accordingly, the relaxation time constant of the L-R circuit can become as long as a few seconds. As a result, a pulse length of current providing a prepolarization magnetic field increases accordingly.

In the method of controlling the prepolarization coil using a power MOSFET device, magnetic induction energy generated at the prepolarization coil in each pulse is entirely dissipated as heat by the power MOSFET device. The magnetic induction energy may be as low as a few kilojoule (kJ) (e.g., 2 kJ with 100 A current on a coil of $L_p$=200 mH) and can easily be tens of kJ (e.g., 18 kJ with 300 A current on the same coil), which requires a large cooling apparatus to remove the heat from the dissipated energy. For this reason, the heating serves as a significant factor to determine the limit of current which may flow to the prepolarization coil.

In low magnetic field NMR/MRI, there is no serious degradation in the image quality from the relaxed uniformity requirement of the prepolarization coil compared to the main magnet of a conventional MRI with comparable main magnet field strength. Therefore, the prepolarization coil may be geometrically simpler than the main magnet coil. Further, since the prepolarization coil is usually driven at a relatively low current, it is typically made of resistive copper wire. The prepolarization coil may generate a magnetic field of about 0.1 to 0.5 T depending on the shape, size, or the position of the object to be magnetized. Generally, current flowing into the prepolarization coil is tens to hundreds of amperes (A). Low magnetic field/very low magnetic field NMR/MRI requires intermittent application of prepolarization magnetic field of usually about 0.1 T or more.

In the case where the prepolarization coil is made of resistive copper conductor, there are two approaches used to decrease the dissipative heating caused by the resistance of the prepolarization coil. One is to increase the sectional area of the conductor. In the case where the prepolarization coil operates at room temperature, resistive heating caused by the conductor resistance may reach a few to tens of kilowatt (kW). Thus, a heavy-duty coil cooling device is necessarily required. Increasing the sectional area of the prepolarization coil can reduce resistive heating of the prepolarization coil when the prepolarization coil is operating at room temperature. In this case, the volume of the prepolarization coil increases accordingly and a cooling device may still be required to maintain the prepolarization coil at room temperature.

The other approach is to cool the prepolarization coil to decrease specific resistance of the copper conductor. If the coil is cooled to below −100 degree centigrade so that copper resistivity decreases to a fraction of its room-temperature resistivity, the coil cooling effect increases significantly since the coil dissipates that much less heat due to its reduced resistivity. To achieve this, the prepolarization coil is generally cooled by submerging it in liquid nitrogen. A dewar for the prepolarization coil may be needed to keep the prepolarization coil submerged in liquid nitrogen during operation. The dewar for the prepolarization coil cools heat generated from the prepolarization coil via vaporization of the liquid nitrogen. In addition, the dewar for a prepolarization coil can maintain a temperature of the coil at vaporization point of the liquid nitrogen, i.e., 77 Kelvin (K) unless the prepolarization coil is exposed above the surface of the liquid nitrogen. Since copper resistivity at 77 K (i.e., vaporization point of liquid nitrogen) is much lower than at room temperature, the prepolarization coil can be considerably smaller. On the other hand, the amount of liquid nitrogen consumed in cooling the dissipated heat from the prepolarization coil is tens of liters (L) per kilowatt-hour (kWh). (22.5 L/kWh to be specific) Thus, the size of the dewar must be large enough to contain the amount of liquid nitrogen necessary to maintain the prepolarization coil submerged during operation. The above-mentioned problems must be addressed in the case where the prepolarization coil is made of a resistive conductor.

SUMMARY

The present invention relates to a nuclear magnetic resonance apparatus with two separate magnet coils to provide magnetization magnetic field, or prepolarization magnetic field, and readout magnetic field separately, with focus on minimizing energy dissipation from the prepolarization magnet coil and driving unit for the coil.

With smaller energy dissipation, the prepolarization coil and the driving unit for the coil can handle higher prepolarization magnetic field so that the nuclear magnetic resonance apparatus can provide higher signal to noise ratio.

In addition, in the case where a SQUID sensor comprises the sensor unit of the nuclear magnetic resonance apparatus in order to take advantage of the lower readout magnetic field, the prepolarization coil size may be small enough and the dissipated heat from the coil may be small enough to enable the integration of the prepolarization coil in the same dewar with the SQUID sensor.

In some embodiments, the nuclear magnetic resonance apparatus may include a dewar containing a low-temperature liquid refrigerant, a prepolarization coil disposed inside the dewar and including a superconducting wire, a prepolarization coil driving unit for intermittent application of electric current to the prepolarization coil in a capacitor charge/discharge manner to generate prepolarization magnetic field, a sensor unit for measuring nuclear magnetic resonance signal from an imaging sample to which the prepolarization magnetic field is applied by the prepolarization coil, and a readout magnetic field generation unit for application of a readout magnetic field to the imaging sample.

In some embodiments, the nuclear magnetic resonance apparatus may include a dewar containing a low-temperature liquid refrigerant, a prepolarization coil disposed inside the dewar and including a superconducting wire, a prepolarization coil driving unit for intermittent application of electric current to the prepolarization coil to generate prepolarization magnetic field, a sensor unit for measuring nuclear magnetic resonance signal from an imaging sample to which the prepolarization magnetic field is applied by the prepolarization coil, and a readout magnetic field generating unit for application of a readout magnetic field to the imaging sample.

In some embodiments, the nuclear magnetic resonance apparatus may include a dewar containing a low-temperature liquid refrigerant, a prepolarization coil disposed inside the dewar; a prepolarization coil driving unit for intermittent application of electric current to the prepolarization coil in a capacitor charge/discharge manner to generate prepolarization magnetic field, a sensor unit for measuring nuclear magnetic resonance signal by an imaging sample to which the prepolarization magnetic field is applied by the prepolarization coil, and a readout magnetic field generation unit for application of a readout magnetic field to the imaging sample.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention.

DETAILED DESCRIPTION OF THE EMBODIMENTS

Figure 1:
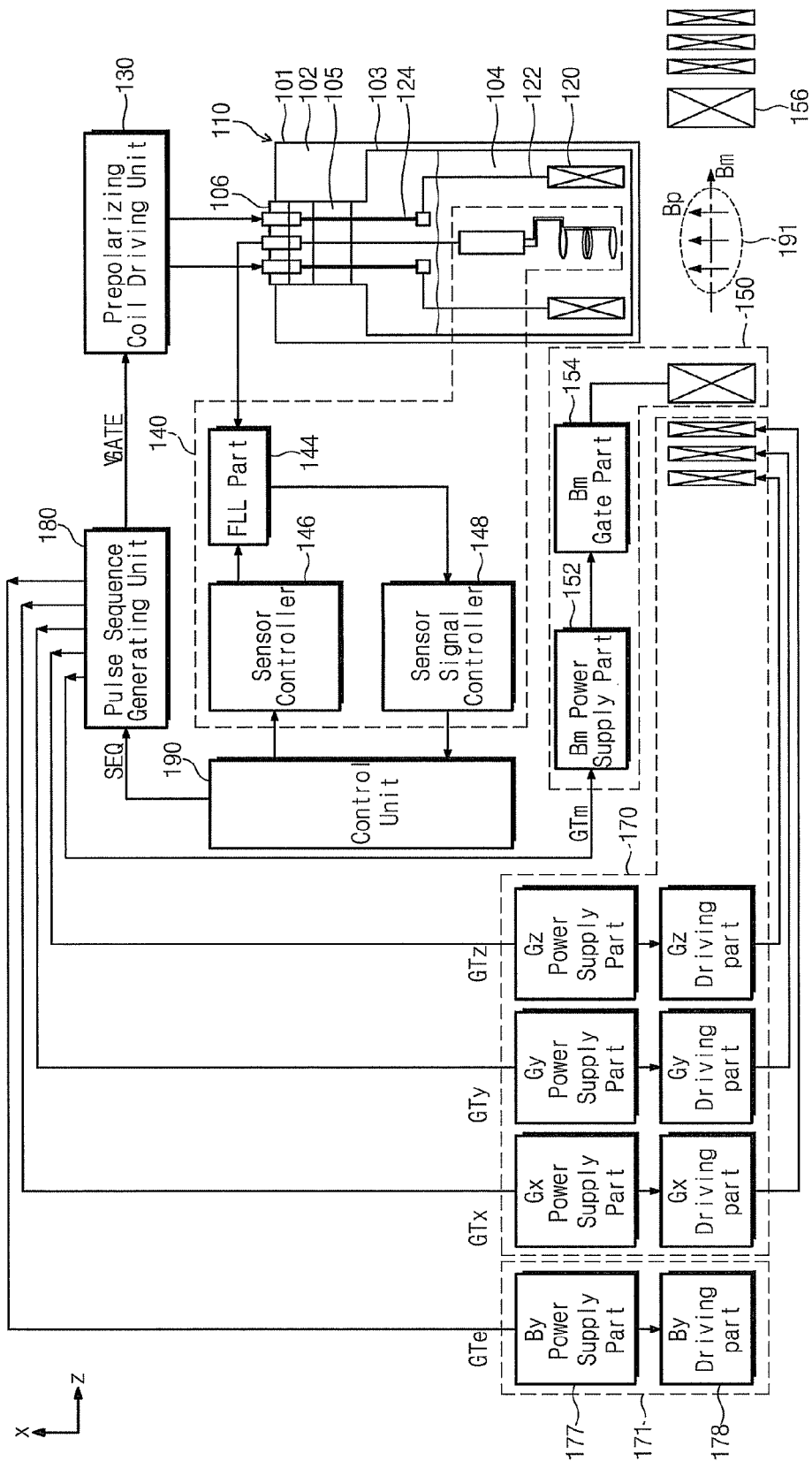
FIG. 1 illustrates a nuclear magnetic resonance apparatus according to some embodiments of the present invention.

A nuclear resonance apparatus according to some embodiments of the present invention uses a superconducting wire, not a resistive wire, as the conductor of the prepolarization coil. After the prepolarization magnetic field has been applied, the current to the prepolarization coil has to be cut off rapidly to eliminate the prepolarization magnetic field completely before the sensor unit is activated and the resonance signal can be detected. The prepolarization coil made of a superconducting wire can easily lose its superconducting characteristics when the current variations becomes too rapid. T overcome this disadvantage, the superconducting wire may include a plurality of superconductor filaments spaced apart from each other and a copper alloy disposed to fill in the space, cover the superconductor filaments and provide a predetermined external diameter. In such a configuration, the superconducting wire does not easily lose superconducting characteristics from rapid current variations. Thus, the superconducting wire can be applied as the conductor for the prepolarization coil for the nuclear magnetic resonance apparatus. The prepolarization coil with superconducting wire allows a great amount of current with orders of magnitude less heating caused by current, even in the case where the conductor is much thinner than that of the resistive copper wire. The superconducting wire of the prepolarization coil may be a high-temperature superconductor or a low-temperature superconductor. In the case where the prepolarization coil is made of a superconducting wire, the coil can be of a small size and have low heat dissipation, so that it may be cooled using liquid helium as well as with liquid nitrogen when a high-temperature superconductor is used. Thus, the dewar containing the low-temperature liquid refrigerant may accommodate both a superconducting quantum interference device (hereinafter referred to as "SQUID") sensor as well as a prepolarization coil made of low-temperature superconductor. The inductance of the prepolarization coil may also be reduced when the prepolarization coil is made of a superconductor, due to its smaller size.

The driving unit of a prepolarization coil according to some embodiments of the present invention does not employ a simple current control scheme where the switch passively lets the current flow and blocks it, causing the switching device to dissipate the magnetic induction energy stored in the energized prepolarization coil as heat. The driving unit instead moves the magnetic induction energy into and out of a large capacitor by changing and discharging it. Thus, this capacitor charge and discharge method can have comparable current falling time as the heat dissipation method while minimizing the energy dissipation resulting from of the change in the current applied to the prepolarization coil. The heat dissipation method has its current rising time determined by the time constant of an L-R circuit formed with the prepolarization coil and the driving circuit, whereas the magnetic induction energy charge/discharge manner has its current rising and falling time determined by the resonance frequency of an L-C circuit formed with the prepolarization coil and the capacitor. Therefore, the current rising time of the capacitor charge/discharge method can be significantly shorter than that of the heat dissipation method, so that the capacitor charge/discharge method may be able to reduce current pulse time required for magnetizing the imaging sample. The capacitor charge/discharge method is also energy-effective since it minimizes the energy dissipation resulting from the intermittent current. Since the capacitor charge/discharge method reuses the magnetic induction energy by charging the energy to the capacitor, and then discharging it to energize the prepolarization coil, heat dissipation of the driving circuit can be reduced by that much. Accordingly, the driving circuit can increase the amount of current into the prepolarization coil.

As a result, an energy-effective NMR/MRI apparatus may be achieved in the case where a superconducting prepolarization coil is coupled with a coil driving unit using the capacitor charge/discharge method. In this case, the current rising time can be shorter with the current falling time remaining comparable and the heat dissipation of the prepolarization coil can be significantly reduced. With the increased amount of current, the size of the coil and hence its inductance can decrease accordingly. A mechanical relay connected in series to the prepolarization coil can eliminate any leakage current possible through the driving unit to increase the signal-to-noise (SNR) ratio of the NMR/MRI apparatus.

A nuclear magnetic resonance apparatus according to some embodiments of the present invention may use a SQUID sensor as the nuclear magnetic resonance signal detector, to take advantage of the reduced readout magnetic field, which may be tens of uT to as low as several uT. In the conventional NMR/MRI, a SQUID sensor, which has higher sensitivity than an RF induction coil, can not be used because it cannot operate in the strong magnetic field of up to a few T produced from the main magnet.

In some embodiments, where a SQUID sensor is used as the nuclear magnetic resonance signal detector, it detects the magnetic field generated by the magnetic spin of the nucleus, which precesses from the applied readout magnetic field, directly. In this case, the strength of the signal depends only on the remnant magnetization of the imaging sample and does not depend on the readout magnetic field strength, in contrast to conventional NMR/MRI where the signal strength is proportional to the magnetization of the imaging sample as well as the Larmor frequency of the spin precession, which depends on the readout magnetic field strength. Therefore, the SQUID sensor is suitable to the low magnetic field NMR/MRI where the intensity of a readout magnetic field is reduced without affecting the magnetization of the imaging sample by being able to maintain the prepolarization magnetic field strong independent of the readout magnetic field.

In some embodiments, where a SQUID sensor is used as the nuclear magnetic resonance signal detector, the sensitivity of the SQUID sensor made of low-temperature superconductor is tens of times higher than that of a SQUID sensor made of high-temperature superconductor. A SQUID sensor made of metal-based (e.g., niobium, Nb) low-temperature superconductor has much better mechanical stability than that of a SQUID sensor made of ceramic-based high-temperature superconductor. In the case where the SQUID sensor is made of low-temperature superconductor, therefore, a dewar accommodating the SQUID sensor should be filled with liquid helium.

A nuclear magnetic resonance apparatus according to an embodiment of the present invention may include one dewar for cooling the SQUID sensor and the prepolarization coil. In the case where the prepolarization coil includes a superconducting wire, the physical size and the heat dissipation of the prepolarization coil are small so that the coil may be cooled with liquid helium instead of liquid nitrogen. Therefore, the superconducting prepolarization can be integrated with the SQUID sensor into dewar containing liquid helium.

In the case where the prepolarization coil is made of a resistive wire, and the coil is integrated with the SQUID sensor into a single liquid helium dewar, latent heat of vaporization of liquid helium is too low to reasonably absorb the heat dissipated by the prepolarization coil. Accordingly, the amount of liquid helium consumed becomes excessively large to be economically infeasible, since the cost of liquid helium can be 100 times or more than that of liquid nitrogen. The size of the resistive copper prepolarization coil and its large heat capacity, cooling the prepolarization coil using liquid helium is also not economically feasible due to the large amount of liquid helium consumption while cooling the prepolarization coil to liquid helium temperature. In this case, therefore, a separate dewar for the prepolarization coil separate from the dewar containing the SQUID sensor may be necessary. The refrigerant for the prepolarization coil can be liquid nitrogen since it can handle the larger heat dissipation and the larger heat capacity of the coil due to its higher latent heat of vaporization of 160 kJ/L, compared to 2.6 kJ/L of liquid helium, and is also significantly cheaper.

The present invention will now be described in detail hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 2:
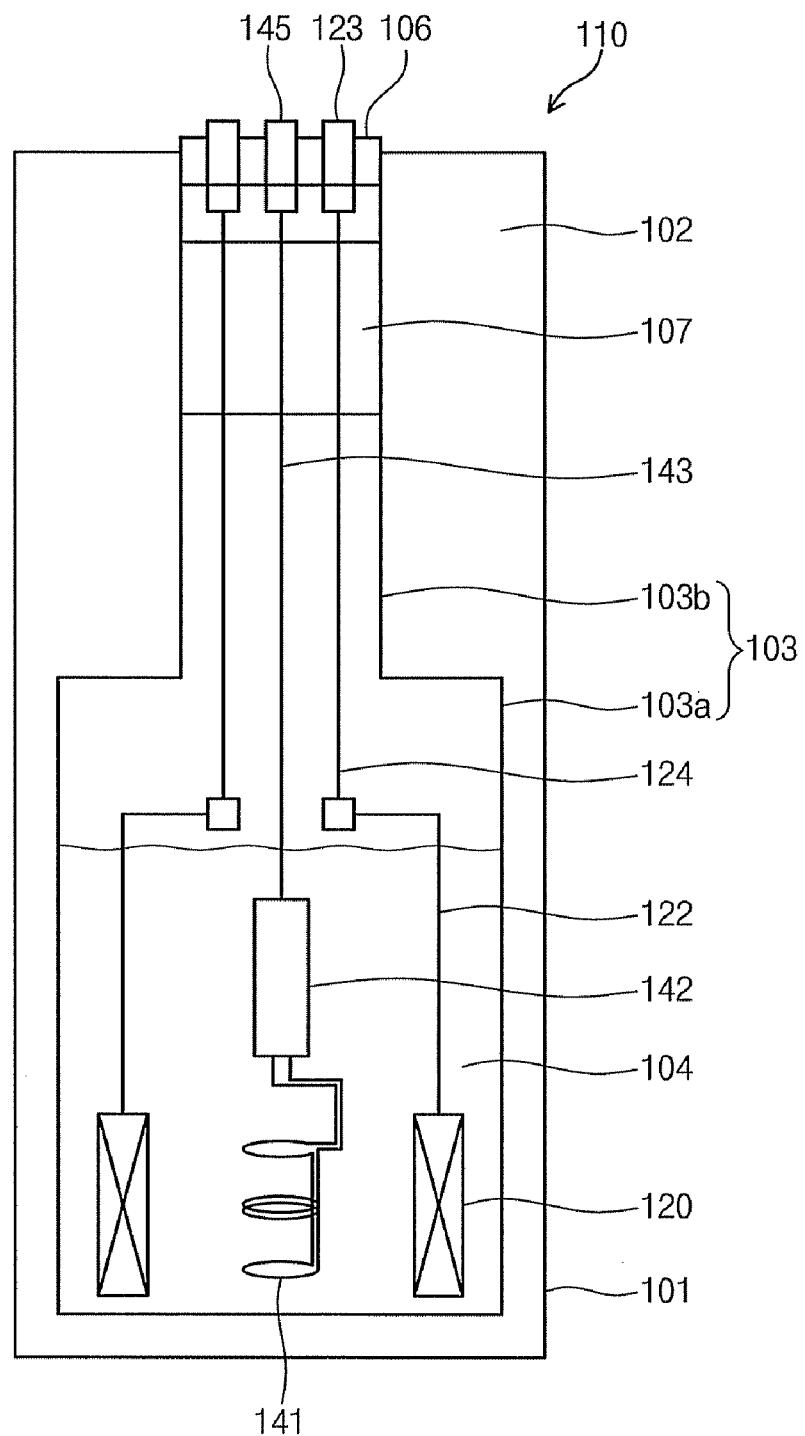
FIG. 2 illustrates a dewar shown in FIG. 1.
Figure 3:
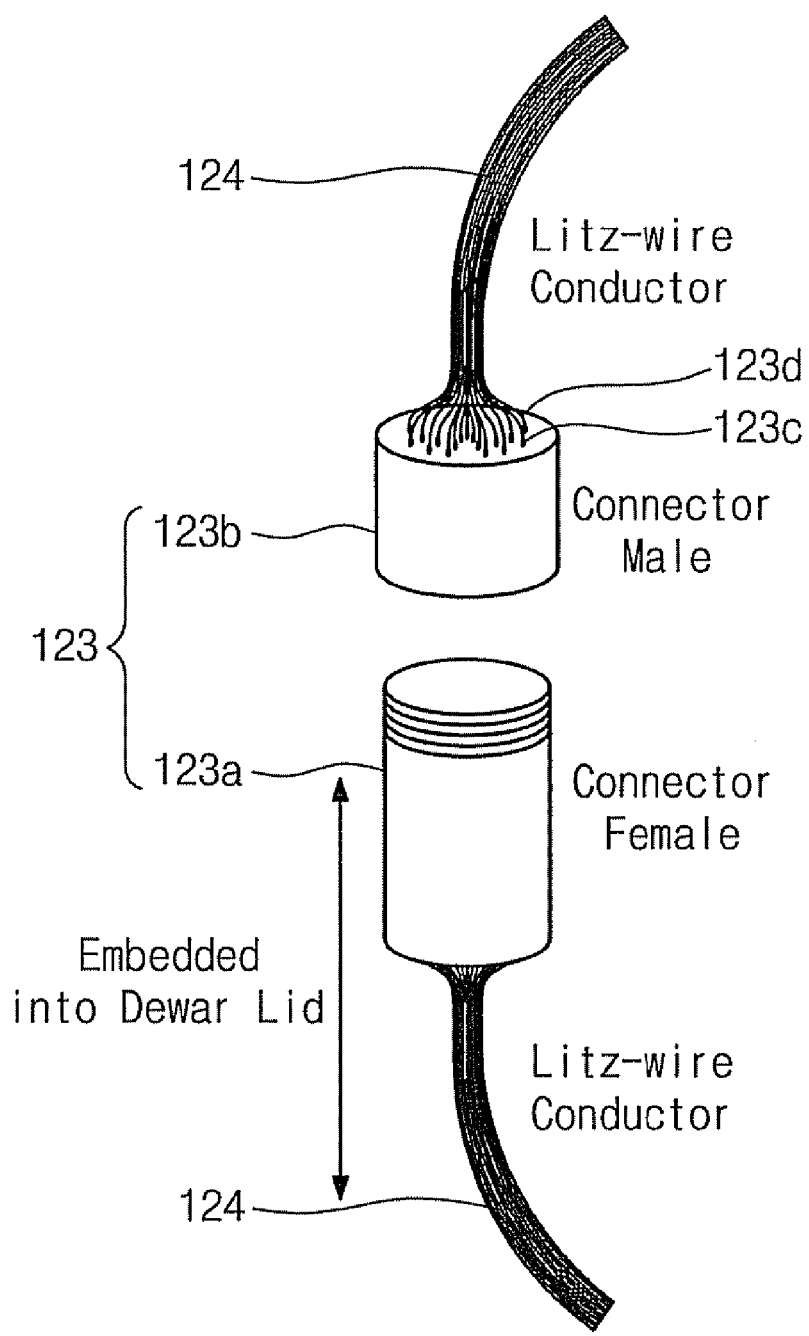
FIG. 3 illustrates a first electric connector shown in FIG. 2.

FIG. 1 illustrates a nuclear magnetic resonance apparatus according to some embodiments of the present invention. FIG. 2 illustrates the dewar shown in FIG. 1, and FIG. 3 illustrates a first electric connector 123 shown in FIG. 2.

Referring to FIGS. 1 and 2, the nuclear magnetic resonance apparatus includes a dewar 110, a prepolarization coil 120, a prepolarization coil driving unit 130, a sensor unit 140, and a readout magnetic field generation unit 150. The dewar 110 contains a low-temperature liquid refrigerant. The prepolarization coil 120 is disposed inside the dewar 110 and includes a superconducting wire. The prepolarization driving unit 130 applies intermittent current to the prepolarization coil 120 to generate a prepolarization magnetic field ($B_p$). Also the prepolarization coil driving unit 130 is of capacitor charge/discharge type. The sensor unit 140 measures a nuclear magnetic resonance signal generated by an imaging sample 191 to which the prepolarization magnetic field ($B_p$) is applied by the prepolarization coil 120. The readout magnetic field generation unit 150 applies a readout magnetic field to the imaging sample 191.

The dewar 110 have a double-wall structure. That is, the dewar 110 includes an outer container 101 and an inner container 103 disposed inside the outer container 101. A space between the outer container 101 and the inner container 103 is in vacuum. The inner container 103 may be divided into a first inner container 103a having a larger inside diameter and a second inner container 103b having a smaller inside diameter. The first and the second inner containers 103a and 103b may be cylindrical in shape and share the central axis. The inner container 103 contains liquid helium 104. The prepolarization coil 120 is disposed inside the first inner container 103a. The second inner container 103b is in contact with the outer container 101. A dewar lid 106 is disposed at the contact between the second inner container 103b and the outer container 101. Two first electrical connectors 123 are disposed in the dewar lid 106 and provide electrical connection to the prepolarization coil 120 disposed inside the interior of the inner container 103. An insulating baffle 107 may be disposed at the top of the second inner container 103b. The insulating baffle 107 reduces thermal conductivity between the inside and the outside of the dewar 110. The insulating baffle 107 may include a single metal plate or a plurality of metal plates and a thick porous heat insulator disposed between the lowermost metal plate and the dewar lid 106.

The prepolarization coil 120 may be made of superconductor. The prepolarization coil 120 is in form of a thick solenoid comprising of a plurality of layers. A first wire 122 is connected to the prepolarization coil 120. A part of the first wire 122 should be submerged in the liquid helium 104, and the other part thereof should be exposed to the exterior of the liquid helium 104. The first wire 104 is made of high-temperature superconductor.

One end of a second wire 124 is connected to the first wire 122 and the other end thereof is connected to the first electrical connector 123. The second wire 124 can be a resistive conductor in the form of a single wire, a stranded wire or Litz-wire. The resistive conductor material can be copper (Cu).

The first wire 122 is made of a ceramic-based high-temperature superconductor. The first wire 122 is configured to prevent heat from the exterior of the dewar 110 through the second wire 124 from being conducted into the liquid helium 104 inside the dewar 110. In the case where the second wire 124 is made of single or stranded wire, effective alternating current (AC) resistance may increase due to the skin effect of the conductor when the current supplied to the prepolarization coil 120 from the prepolarization coil driving unit 130 is rapidly varied. In the case where the second wire 124 is made of single or stranded wire, the effective longitudinal cross section area of the conductor increases and thermal current (Johnson noise) increases accordingly. Magnetic field generated from the thermal current may increase the noise baseline measured by the sensor 140. The intensity of the thermal noise current decreases as the conductor becomes thinner and longer. The second wire 124 may include Litz-wire, comprising a plurality of twisted individually insulated conductors, to reduce the effective alternating-current resistance, by reducing the cross section area of each individual conductors, hence reducing the skin effect, and minimize the thermal noise current, by reducing the effective longitudinal cross section area.

In some embodiments, the second wire 124 may include Litz-wire composed of 200 twisted individually insulated copper conductors of 0.5 millimeter (mm) diameter each. In this case, the total diameter of the second wire 124 is about 8 mm. When a current of 100 ampere (A) flows to the second wire 124, resistive heating produced from the second wire 124 is about 4.3 watt (W) per 1 meter at room temperature. In the case where cooling is disregarded, this heating can raise the temperature of the second wire 124 by 0.3° C./second. With the second wire 124 being cooled by air, the actual temperature rise is practically insignificant.

The second wire 124 can be configured to further minimize the thermal noise generation with the first electrical connector 123 as described in FIG. 3. The first electrical connector 123 here includes a female connector 123a and a male connector 123b. The male electrical connector 123b includes a plurality of contact pins 123c such that copper conductors 123d constituting the second wire 124 have independent terminals for each strand respectively while being insulated from each other. The female electrical connector 123a has the same configuration as the male counterpart. This first electrical connector 123 configuration may prevent the formation of a short conductor loop of individual copper conductors forming the second wire 124 inside the dewar 110 which can increase the intensity of the thermal noise.

Returning to FIGS. 1 and 2, the sensor unit 140 includes a flux transformer 141 to sense and attenuate or amplify the magnetic flux incident through the input coil, a SQUID 142 to receive an output signal of the flux transformer 141 and transform the magnetic flux to a voltage signal, a flux locked loop (FLL) part 144 to linearize the signal of the SQUID 142 as a voltage signal proportional to the detected magnetic flux beyond the range of a single magnetic flux, a sensor signal processor 148 to process the linearized signal from the FLL part 144 and reduce the noise and amplify the signal, and a sensor controller 146 to provide a control the FLL part 144 according to the command received from the control unit 190.

The SQUID 142 is a transducer which converts variation of external magnetic flux into voltage by taking advantage of Josephson effect and flux quantization effect that only superconductors exhibit. The SQUID 142 is a magnetic sensor in which one superconducting loop incorporating one or two Josephson junctions. An RF SQUID is a SQUID in which the superconducting loop incorporates one Josephson junction, while a DC SQUID is a SQUID in which the superconducting loop incorporates two Josephson junctions. The RF SQUID produces an AC signal in the radio frequency in which the frequency varies as a function of the magnetic flux applied inside the superconducting loop. The DC SQUID produces a DC voltage as a function for the applied magnetic flux. The relation between the signal, RF frequency for RF SQUID and DC voltage for DC SQUID, and the applied magnetic flux is a periodic function with a period being the magnetic flux quantum $\phi 0$ ($=2.07 \times 10^{-15}$ Wb). The detailed form of the function depends to a detailed structure of the RF or DC SQUID.

The flux transformer 141 includes a pickup coil for detecting the applied magnetic flux and an input coil to reproduce the flux, with an attenuation or amplification factor that depends on the geometries of both coils, and apply the flux to the SQUID. The flux transformer 141 is superconducting so that the flux detected by the pickup coil is relayed to the SQUID without any loss. The pickup coil usually have a wide area to detect larger flux while the input coil has an area to the SQUID for optimal flux transfer the SQUID. The input coil may be wound many times to reduce its amplification factor, or even to attenuate the detected flux. The flux transformer 141 can be a magnetometer where a pickup coil includes one loop or a gradiometer where a pickup coil includes one or more pairs of loops wound in opposite directions. The SQUID 142 is connected to a second electrical connector 145 through a conductor 143. The second electrical connector 145 is connected to the FLL part 144.

The FLL part 144 includes an input terminal to receive the signal from the SQUID 142, an integrator, a feedback linearization circuit, and a feedback coil. The FLL part 144 outputs a voltage signal proportional to the magnetic flux detected by the pickup coil that has range orders of magnitude wider than the magnetic flux quantum value $\phi 0$.

According to modified embodiments, the sensor unit 140 may have alternative magnetic sensors like atomic magnetometer sensor or magnetoresistance sensor in place of the SQUID sensor.

The readout magnetic field generation unit 150 generates a readout magnetic field ($B_m$) which is spatially uniform and low in magnitude. The readout magnetic field generation unit 150 includes a readout magnetic field power supply part 152, a readout magnetic field gate part 154, and a readout coil 156. The readout magnetic field gate part 154 controls the current applied to the readout coil 156 to enable or disable the generation of the readout magnetic field.

A gradient magnetic field generation unit 170 includes a $G_x$ power supply part, a $G_x$ driving part, and a $G_x$ coil to generate a gradient magnetic field in the direction of x-axis ($dB_z/dx$). The gradient magnetic field generation unit 170 includes a $G_y$ power supply part, a $G_y$ driving part, and a $G_y$ coil to generate a gradient magnetic field in the direction of y-axis ($dB_z/dy$). The gradient magnetic field generation unit 170 includes a $G_z$ power supply part, a $G_z$ driving part, and a $G_z$ coil to generate a gradient magnetic field in the direction of z-axis ($dB_z/dz$). The disposition of the $G_x$, $G_y$, and $G_z$ coils is merely an example for applying a gradient magnetic field to a sample and is not limited thereto.

An excitation magnetic field generation unit 171 may include a $B_y$ power supply part 177, a $B_y$ gate part 178, and a $B_y$ coil (not shown).

A pulse sequence generation unit 180 provides pulse sequence signals $G_{Tm}$, $G_{Tx}$, $G_{Ty}$, $G_{Tz}$, and $G_{Te}$ to the readout magnetic field generation unit 150, the gradient magnetic field generation unit 170, and the excitation magnetic field generation unit 171 to scan the imaging sample 191 and obtain an image.

The prepolarization coil driving unit 130 provides the electrical current for the prepolarization coil 120 to apply the prepolarization magnetic field ($B_p$) to the sample 191 in the form of a 2-4 seconds wide pulse after receiving a gate driving signal $V_{GATE}$ from the pulse sequence generation unit 180.

A control unit 190 processes the output signal of the sensor unit 140 via sensor signal controller 148 and control the sensor controller 146, the pulse sequence generation unit 180, and through it, magnetic field generation units 150 and 170.

Figure 4:
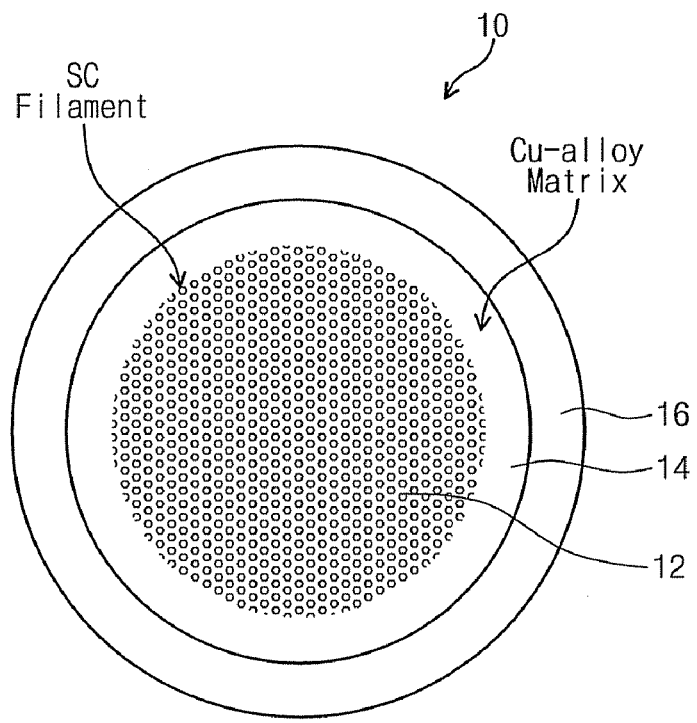
FIG. 4 illustrates a superconducting wire constituting the prepolarization coil according to some embodiments of the present invention.

FIG. 4 illustrates a superconducting wire 10 constituting the prepolarization coil according to some embodiments of the present invention.

Referring to FIG. 4, the superconducting wire 10 must minimize AC heat loss which occurs when current varies rapidly while not being quenched, i.e. retaining its own superconducting characteristics, during the rapid current variation. For this, the superconducting wire 10 includes fine superconductor filaments 12 closely arranged in a matrix 14. The matrix 14 may include copper (Cu) or Cu-alloy.

To decrease the AC heat loss from magnetic hysteresis inside the superconductor, the diameter of the superconducting filament 12 has to be small. When the matrix 14 includes copper-based materials such as CuNi and CuMn, specific resistance of the copper-based materials is about 1000 times higher than that of pure copper at 4.2 K, the vaporization point of liquid helium. Thus, the matrix 14 can rapidly attenuate eddy current generated by current variation, another source of AC heat loss in the superconducting wire.

The superconducting filament 12 is low-temperature superconductor. The superconducting filament 12 may be one of NbTi, $Nb_3Sn$, and $MgB_2$. A metal sheath 16 may be disposed to cover the matrix 14. Thermal conductivity and electrical conductivity of the metal sheath 16 is chosen to be higher than those of the matrix 14. Thus, the metal sheath 16 can serve to prevent propagation of quenching if and when it occurs and to recover superconductivity rapidly.

A superconducting wire according to some embodiments of the present invention may have a structure where NbTi superconductor filaments are about 0.14 micron in diameter and are embedded in a copper-nickel alloy matrix. If the diameter of the superconducting wire is 0.2 mm and the total volume of the prepolarization coil is 200 cm$^3$, current rising and falling times can be 5 microseconds (msec) each, and when a current pulse of 1,000 A is applied, the coil can generate a magnetic field of 0.5 T. In this case, expected heat loss can be up to 40 millijoule (mJ) per pulse. Assuming the pulse is applied once every four seconds, expected heat loss can be up to 10 milliwatts (mW). In comparison, when a prepolarization coil made of a resistive copper coil with total resistance of 0.58 ohm generates a field of 0.2 T with 40 A of applied current at liquid nitrogen temperature (77 K), heat loss is about 1 kilowatt (kW), roughly 100,000 times the heat loss of the superconducting prepolarization coil. As a result, the superconducting prepolarization coil can maintain the evaporation loss of liquid helium to an acceptable level while being integrated into the same dewar with the SQUID sensor.

Figure 5:
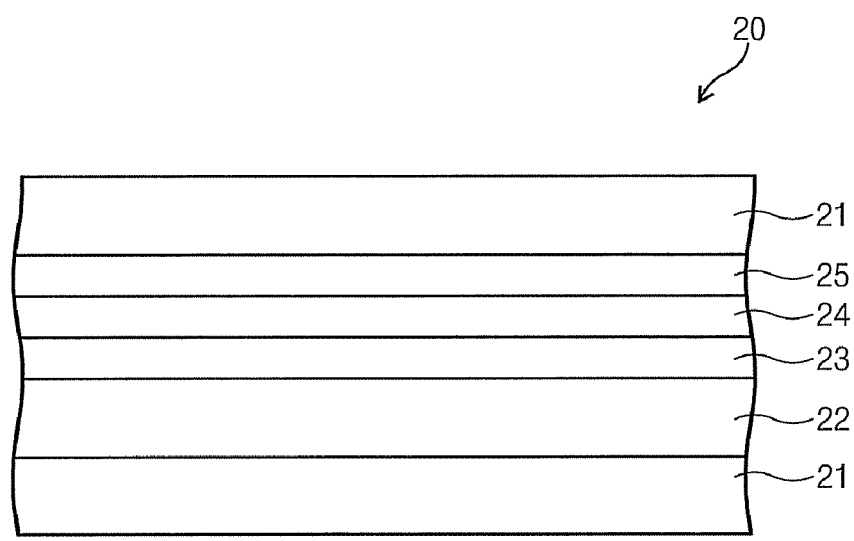
FIG. 5 illustrates a superconducting wire constituting the prepolarization coil according to some embodiments of the present invention.

FIG. 5 illustrates a superconducting wire 20 constituting the polarizing coil according to some embodiments of the present invention.

Referring to FIG. 5, the superconducting wire 20 is an example of a linear wire obtained by mechanically stabilizing a high-temperature superconductor made of fragile ceramic material. The superconducting wire 20 includes a buffer layer 23, a superconductor 24, and a conductive protection layer 25 which are sequentially stacked on a substrate material 22. The copper stabilizer layer 21 is disposed to cover the buffer layer 23, the superconductor 24, and the conductive protective layer 25 on top of the substrate 22.

The substrate material 22 typically employs a Hastelloy, a family of nickel alloy, with a thickness of about 50 um, which exhibits a high anti-tensile force and mechanical stability.

The buffer layer 23 includes oxides, such as $LaMnO_3$, MgO, $Y_2O_3$, and $Al_2O_3$, stacked on the substrate material 22 to act as mechanical buffer.

The superconductor 24 is stacked on the buffer layer 23 to a thickness of about 1 um. The superconductor 24 may include a YBCO-based high-temperature superconductor.

The conductive protection layer 25 is stacked on the superconductor 24 to a thickness of about 2 um. The conductive protective layer 25 may serve to electrically connect the superconductor 24 with an external conductor. The conductive protective layer 25 must exhibit a high anti-corrosion property. The conductive protective layer 25 is usually made of silver (Ag).

The copper stabilizer layer 21 can be disposed to cover the substrate material 22, the buffer layer 23, the superconductor 24, and the conductive protective layer 25 to a thickness of about 20 um. The copper stabilizer layer 21 can absorb the eddy current, which is generated when current flowing to the superconductor 24 changes, through resistive heating to reduce AC loss of the superconducting wire 20.

Figure 6:
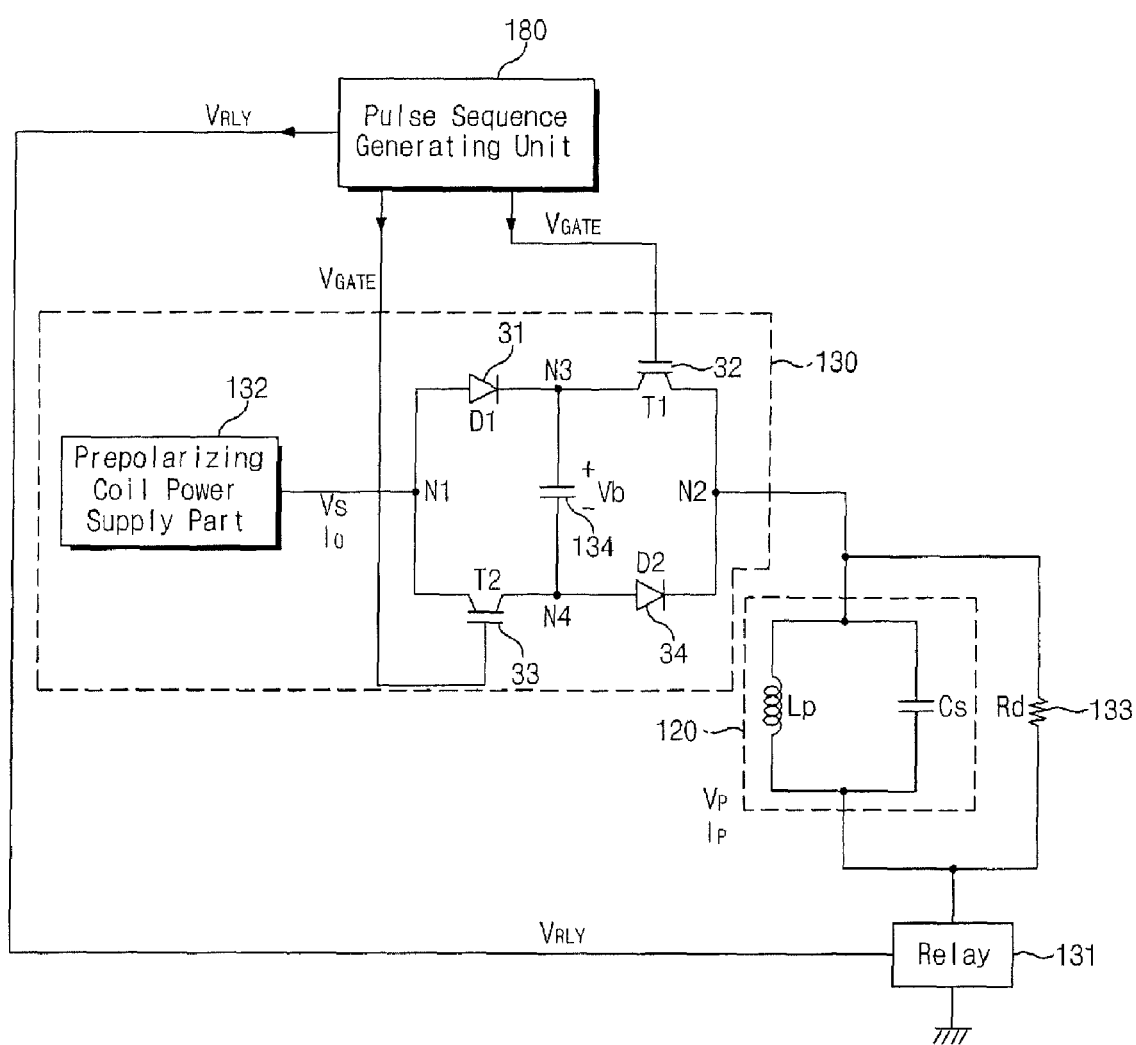
FIG. 6 illustrates the prepolarization coil driving unit of the nuclear magnetic resonance apparatus according to some embodiments of the present invention.

FIG. 6 illustrates a prepolarization coil driving unit 130 of a nuclear magnetic resonance apparatus according to some embodiments of the present invention. As illustrated, the prepolarization coil driving unit 130 includes a first diode 31 connected to a first terminal N1, a first power transistor 32 having one end connected in series to the first diode 31 and the other end connected to a second terminal N2, a second power transistor 33 connected to the terminal N2, a second diode 34 having one end connected to the second power transistor 33 and the other end connected to the second terminal N2, and a capacitor bank 134. The capacitor bank 134 is disposed between a third terminal N3 between the first diode 31 and the first power transistor 32 and a fourth terminal N4 between the second diode 34 and the second power transistor 33. The prepolarization coil 120 is connected to the second terminal N2.

An equivalent circuit of the prepolarization coil 120 may be divided into an inductance $L_p$ and parasitic capacitance C. The inductance $L_p$ of the prepolarization coil 120 may have a large value of hundreds of millihenry (mH). Equivalent resistance Rp of the prepolarization coil 120 may be typically below 1 ohm in the case where the prepolarization coil 120 is made of resistive coil.

Figure 12:
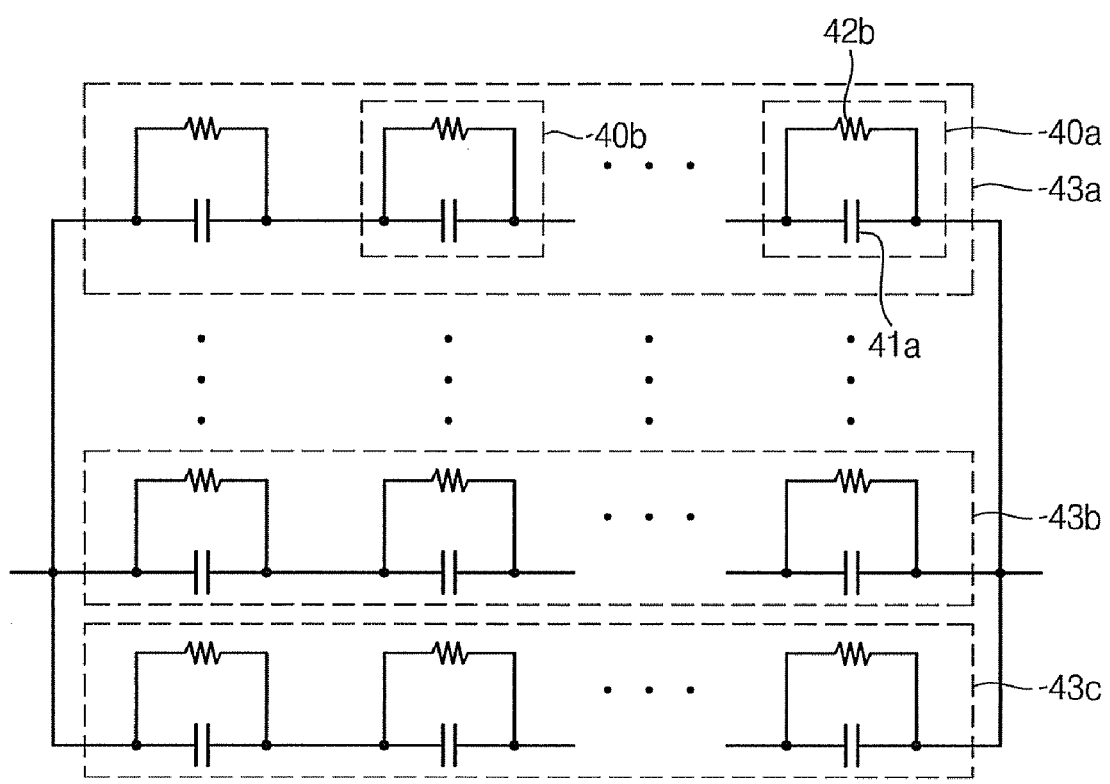
FIG. 12 illustrates a configuration of the capacitor bank according to some embodiments of the present invention.

Capacitance of the capacitor 134, which can be either a single capacitor or a capacitor bank as described in FIG. 12, can range from tens of microfarads (uF) to several millifarads (mF). In the case where the capacitance of the capacitor 134 is below the order of mF, individual capacitors constituting the capacitor bank 134 may include an aluminum electrolytic capacitor as well as a film or metal thin film capacitor which exhibits low effective serial resistance (ESR) and low leakage current. Since an electrolytic capacitor has a polarity but the voltage applied to the capacitor 134 is constant in the driving circuit 130, the capacitor may be connected to match its polarity with the polarity of the applied voltage.

The first and the second power transistors T1 and T2 may include at least one of an insulated-gate bipolar transistor (IGBT), a bipolar junction transistor (BJT), a metal oxide silicon field effect transistor (MOSFE T), and a static induction transistor (SIT). It is desirable that each of the first and second transistors T1 and T2 be an IGBT.

A pulse sequence generation unit 180 or a power transistor driving unit (not shown) may output a gate driving signal $V_{GATE}$ for driving the first and second transistors T1 and T2. The gate driving signal $V_{GATE}$ may be provided to gates of the first and second power transistors T1 and T2.

A bypass resistor 133 may be connected in parallel to the prepolarization coil 120. The inductance $L_p$ and the parasitic capacitance $C_s$ of the prepolarization coil 120 constitutes an L-C resonance circuit to cause a ringing transient when the current through the coil changes rapidly. The resistor 133 with it resistance value as $(L/C)^{1/2}/2$ changes the L-C circuit into an L-C-R circuit with critical damping.

A prepolarization coil power supply part 132 is connected to the first terminal N1. When a constant maximum current flows from the prepolarization coil power supply part 132, the current and the voltage of the prepolarization coil power supply part 132 is $I_0$ and $V_s$, respectively.

A relay 131 can be connected in series to the prepolarization coil 120. The relay 131 should be of a mechanical contactor-type. When the first and second power transistors T1 and T2 remains in an OFF state and the capacitor bank 134 remains in fully charged state, the relay 131 blocks any leakage current which may flow to the prepolarization coil 120

When the current supplied to the prepolarization coil 120 is turned on and off by the driving circuit 130, the waveform of the increasing or decreasing current $I_p$ through the prepolarization coil 120 corresponds to a quarter period of a sinusoidal curve. And the waveform of the voltage $V_p$ on the prepolarization coil 120 corresponds to a similar sinusoidal waveform as Ip, albeit with an added phase of $\pi/2$.

When the rising and falling times of the current $I_p$ are simply calculated while disregarding the internal resistance of a circuit, they are expressed as below:

$$t_{ru}=t_{rd}=(\pi/2)(L_p C_b)^{1/2}, \text{ or } C_b=(4t_{rd}^2)/(\pi L_p) \qquad \text{[Equation (1)]}$$

wherein $L_p$ represents the inductance of the prepolarization coil 120, and $C_b$ represents the capacitance of the capacitor 134 of the prepolarization coil power supply part 132.

Figure 8:
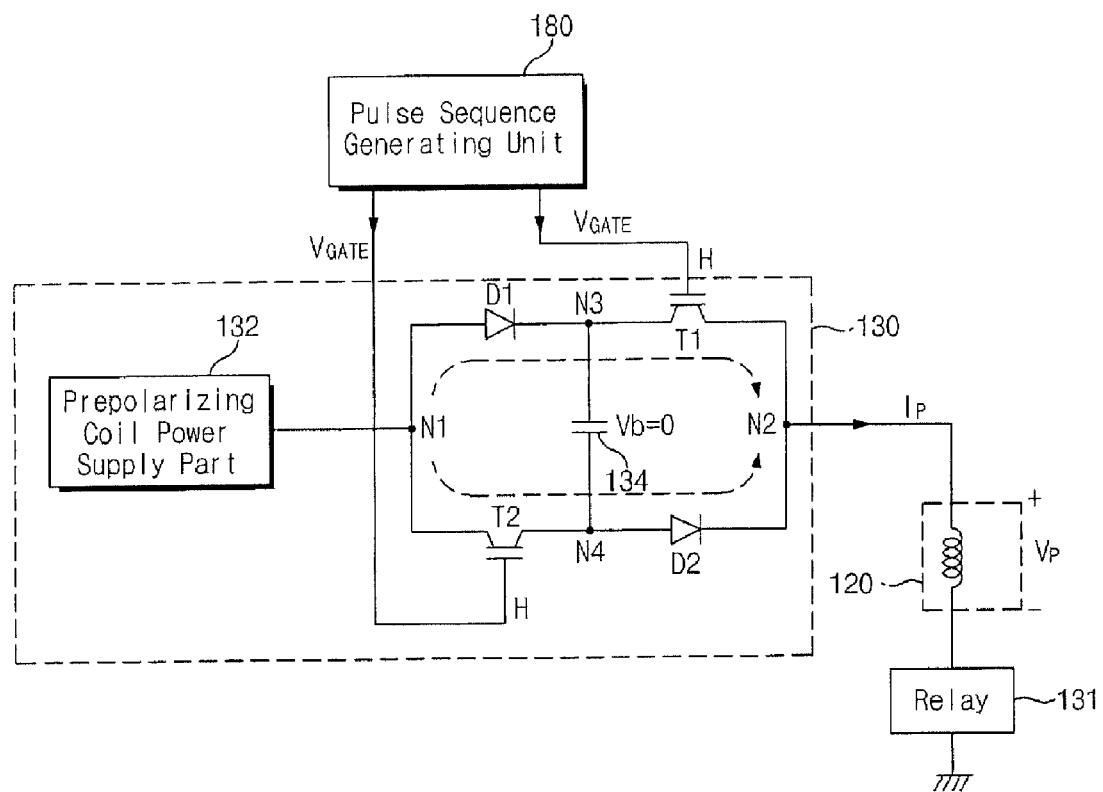

The maximum voltage $V_{CMAX}$ of $V_P$ on the prepolarization coil 120 is expressed as below:

$$V_{CMAX}=V_S+I_0(L_p/C_b)^{1/2} \qquad \text{[Equation (2)]}$$

wherein $I_0$ represents the maximum current and $V_s$ represents a supply voltage from the prepolarization coil power supply part 132 in the fully conducting state as described in FIG. 8.

In practice, however, since there is a non-trivial internal resistance in the driving circuit 130, a correction term from the internal resistance is added to the calculated values of the equations 1 and 2. The correction term changes the calculated values so that the current rising time $T_{ru}$ becomes shorter; the current falling time $T_{rd}$ becomes longer; and the maximum voltage $V_{CMAX}$ on the prepolarization coil 120 becomes lower with increasing internal resistance. If the inductance $L_p$ of the prepolarization coil 120 is known and the desired current falling time $T_{rd}$ is determined, the required capacitance $C_b$ of the capacitor 134 can be calculated by the Equation (2).

The characteristics of the prepolarization coil driving unit 130 according to some embodiments of the present invention will now be described in detail. The description will be made with respect to an actual experimental case performed with a prepolarization coil formed of copper resistive conductor where the total resistance of the prepolarization coil was 0.58 ohm. In this particular example, the inductance $L_p$ of the prepolarization coil was 230 mH; the capacitance $C_b$ of the capacitor was 110; and the maximum current $I_0$ the prepolarization coil driving unit was capable of providing was 60 A. The measured current falling time $T_{rd}$ and the measured maximum voltage at both ends of the coil were 8.6 ms and 1.5 kV, respectively. When the maximum current $I_0$ of 60 A flowed to the prepolarization coil, the resulting resistive heating was 2.1 kW. Since the resistive is proportional to the square of the applied current, it is therefore difficult to increase the current $I_0$ over a certain value due to the excessive heating. Accordingly, in the case where the prepolarization coil 120 is made of a superconductor, the limitation on the current $I_0$ applied to the prepolarization coil 120 from the resistive heating does not apply anymore. As the current provided for the coil increases, the size of the prepolarization coil 120 to generate the same magnitude of prepolarization magnetic field can accordingly be smaller. Also, the inductance $L_p$ of the prepolarization coil 120 can be reduced as much. If the inductance $L_p$ of the prepolarization coil 120 is reduced, the current rising time $T_{rd}$ with the same capacitor $C_b$, the maximum voltage $V_{CMAX}$ on the prepolarization coil 120 also decrease accordingly.

The voltage rating of the capacitor 134 can be increased by forming a capacitor bank where a plurality of capacitors are connected in series with a resistor connected in parallel to each capacitor. The decreased capacitance from the serial connection of the capacitors can be supplemented by forming parallel connections of the same capacitor banks as described in FIG. 12. However, it is more difficult to increase the voltage rating of the power transistors T1 and T2 and diodes D1 and D2 through their serial connection. Thus, the lowest voltage rating among the power transistors and the diodes usually determines the possible maximum voltage $V_{CMAX}$.

There are currently commercialized diode modules with a voltage rating of 10 kV or greater. However, the highest voltage rating of single IGBT modules is 6.5 kV. In the case where the inductance $L_p$ of the prepolarization coil 120 is 230 mH and the driving current $I_0$ is 200 A, the current rising time $T_{rd}$ must be no shorter than 6.5 msec to maintain a maximum voltage $V_{CMAX}$ or 6.5 kV or less. When the current falling time $T_{rd}$ is set to 5 msec, the driving current $I_0$ is limited to 150 A with the same maximum voltage $V_{CMAX}$ limit of 6.5 kV. One way to overcome this limitation is reducing the inductance $L_p$ by decreasing the size of the prepolarization coil 120. If the inductance $L_p$ can be reduced to 50 mH, the current falling time $T_{rd}$ may be reduced to 3 msec with $I_0$ of 200 A and $V_{CMAX}$ limitation of 6.5 kV. When the current falling time $T_{rd}$ is set to 5 ms, the driving current $I_0$ may reach 320 A with the same $V_{CMAX}$ limitation. The application of a superconductor to prepolarization coil allows the construction significantly smaller coil and smaller inductance so the short current falling time $T_{rd}$ can be maintained with high coil driving current $I_0$.

When the capacitor 134 is fully charged, the voltage across it should be equivalent to the maximum voltage $V_{CMAX}$ on the prepolarization coil 120. The maximum voltage $V_{CMAX}$ is also the voltage that the power transistors T1 and T2 and the diodes D1 and D2 must endure. Thus, the power transistors T1 and T2 and the diodes D1 and D2 must allow high current to flow readily while have a voltage rating of several kV. However, such power transistors and diodes are only available in the form of modules and cannot avoid a considerable amount of leakage current ranging from hundreds of µA up to several tens of mA.

As an example of how such leakage current can affect the operation of the NMR/MRI, it is assumed that a ratio of a prepolarization magnetic field $B_p$ to supplied current is 0.1 mT/A (the intensity of 0.1 T is made when a current of 100 A flows through the prepolarization coil) during design of the prepolarization coil. Under this assumption, with a leakage current of 1 mA, a magnetic field of 0.1 µT is generated. This amount of leakage current generated magnetic field not trivial compared to the readout magnetic field with a magnitude of only several µT. Especially in the case of MRI systems, since the prepolarization coil 120 is not designed to generate a uniform magnetic field, even a small magnetic field of 0.1 µT or less from the leakage current can present significant artifact to the obtained image so the leakage current must be blocked during signal detection.

A mechanical contact-type relay 131 with high current capacity can physically cut off the electrical connection between the prepolarization coil 120 and the prepolarization coil driving unit 130. When current flowing to the prepolarization coil 120 is blocked by the relay, an inductive kickback voltage is generated. The inductive kickback voltage should be small enough to ensure that the prepolarization coil driving unit 130 can endure it, so the relay 131 should be closed after the power transistors T1 and T2 are turned off and the current flowing through the relay is a fraction of an ampere, in which case the inductive kickback voltage can be lower than the voltage rating of the devices in the driving unit 130. On the other hand, the relay 131 has a certain delay in the milliseconds to tens of millisecond range between reception of the switching signal and the time when the contact actually makes or breaks. Thus, the relay driving signal $V_{RLY}$ from the pulse signal generation unit 180 controlling the relay 131 may need to be issued before the transistors T1 and T2 turns off. In the case where the delay of the relay 131 $t_{d1}$ is longer than the current falling time t, the relay driving signal $V_{RLY}$ is issued in advance of the transistor gating signal $V_{GATE}$, with the time interval between the two event being $t_{d2}$, which is slightly longer than the difference of $t_{d1}$ and $t_{rd}$.

FIGS. 7 to 10 illustrate operations of the prepolarization coil driving unit of a nuclear magnetic resonance apparatus according to some embodiments of the present invention. FIG. 11 is a timing diagram of the circuit shown in FIGS. 7 to 10.

Figure 7:
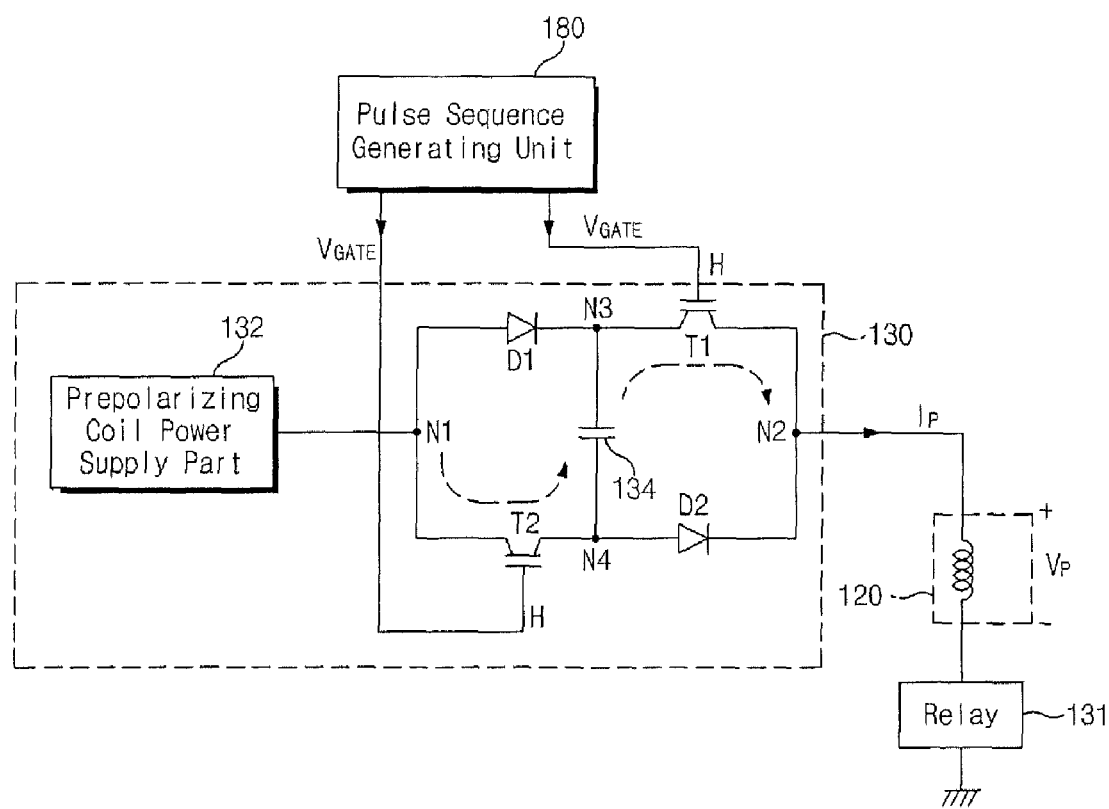
FIGS. 7 to 10 illustrate operation of the prepolarization coil driving unit of the nuclear magnetic resonance apparatus according to some embodiments of the present invention.

Referring to FIGS. 7 and 11, the first and the second power transistors T1 and T2 are turned on by the gate driving signal $V_{GATE}$ while a capacitor bank 134 is fully charged. The first and the second diodes D1 and D2 are reverse biased by the previously charged capacitor bank 134 and block the current from flowing through them. Thus, the current can only flow through the second power transistor T2, the capacitor bank 134, the first power transistor T1, the prepolarization coil 120, and the relay 131. The current $I_p$ flowing to the prepolarization coil 120 is provided while the supply voltage $V_s$ from the prepolarization coil power supply part 132 is added to the voltage $V_b$ from the capacitor 134 as it is discharged. As the capacitor 134 is discharged, the voltage $V_b$ of the capacitor 134 drops and the voltage $V_p$ of the prepolarization coil 120 drops with time from the initial maximum voltage $V_{CMAX}$ to 0 when the prepolarization coil 120 is fully energized and the capacitor is fully discharged. Moreover, the waveform of the current $I_p$ flowing through the prepolarization coil 120 is similar to that of the current flowing in the case where the charged capacitor 134 is abruptly connected to the prepolarization coil 120, which is an inductor. In this case, the waveform of the current $I_p$ flowing to the prepolarization coil 120 becomes equivalent to a quarter of a waveform of L-C resonance. The phase A in FIG. 11 corresponds to the state in FIG. 7.

Referring to FIG. 8, when the capacitor bank 134 is fully discharged, current flowing to the prepolarization coil 120 reaches the maximum current $I_0$ and a voltage $V_p$ on the prepolarization coil 120 is maintained at the supply voltage $V_s$ of the prepolarization coil power supply part 132. The voltage of the fully discharged capacitor 134 is zero and no current flows through the capacitor 134. Therefore, current through the prepolarization coil power supply part 132 is flows through the two paths, one being through the first diode D1 and the first power transistor T1 and the other being through the second power transistor T2 and the second diode D2. The phase B in FIG. 11 corresponds to the state in FIG. 8.

Figure 9:
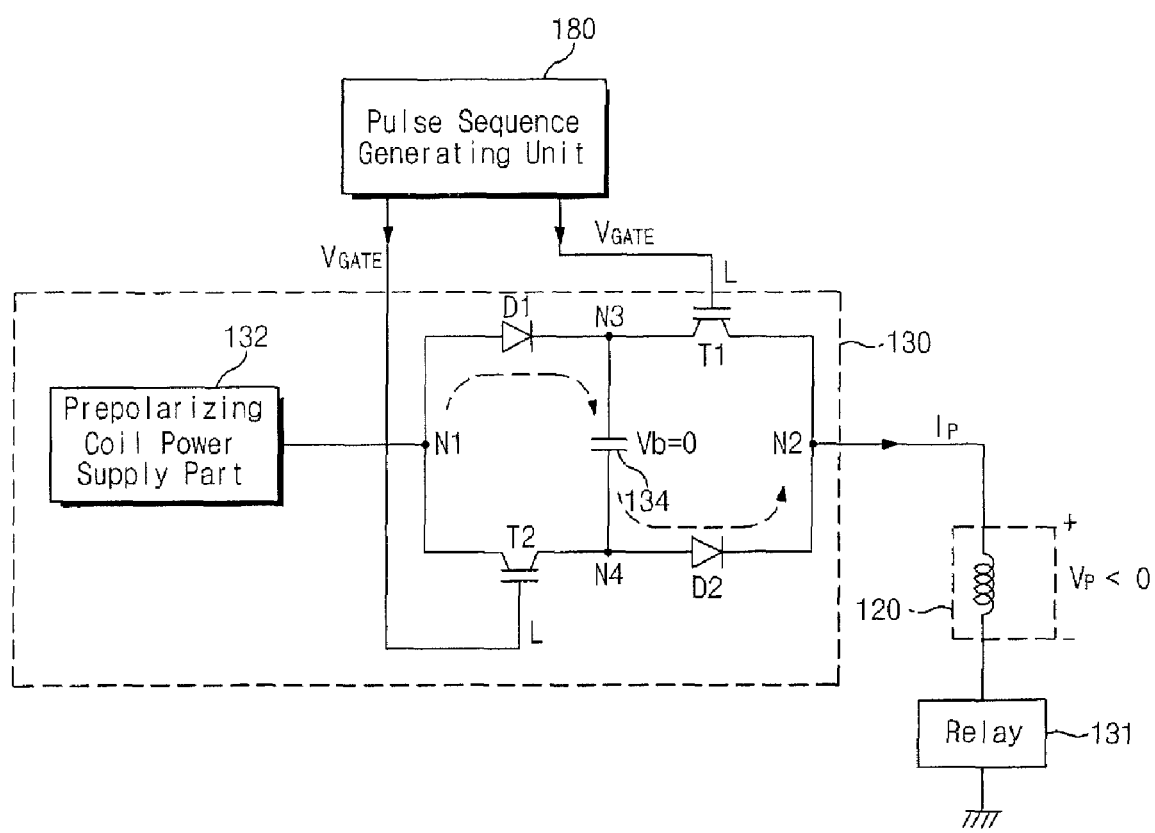

Referring to FIG. 9, when the first and the second power transistors T1 and T2 are turned off by the gate driving signal $V_{GATE}$, current flows only through the first diode D1, the capacitor 134, the second diode D2, the prepolarization coil 120, and the relay 131. As the first and second power transistors T1 and T2 are turned off, the circuit formed by the prepolarization coil driving unit 130 and the prepolarization coil 120 is converted to an L-C-R circuit from the previous L-R circuit as described in FIG. 8. This L-C-R circuit is similar to that described in FIG. 7, but here the capacitor 134 is connected in reverse through the diodes D1 and D2 in contrast to the case of FIG. 7 where the capacitor 134 is connected through the power transistors T1 and T2. Current flowing through the prepolarization coil starts to decrease as the capacitor 134 is being charged from the inductive kick-back voltage from the change in the current through the prepolarization coil. In this way, the energy stored in the prepolarization coil in the form of magnetic induction energy is transferred to the capacitor 134 through the first and second diodes D1 and D2. The voltage $V_b$ of the capacitor 134 increases until the current $I_p$ through the prepolarization coil 120 becomes zero. The phase C in FIG. 11 corresponds to the state in FIG. 9.

Figure 10:
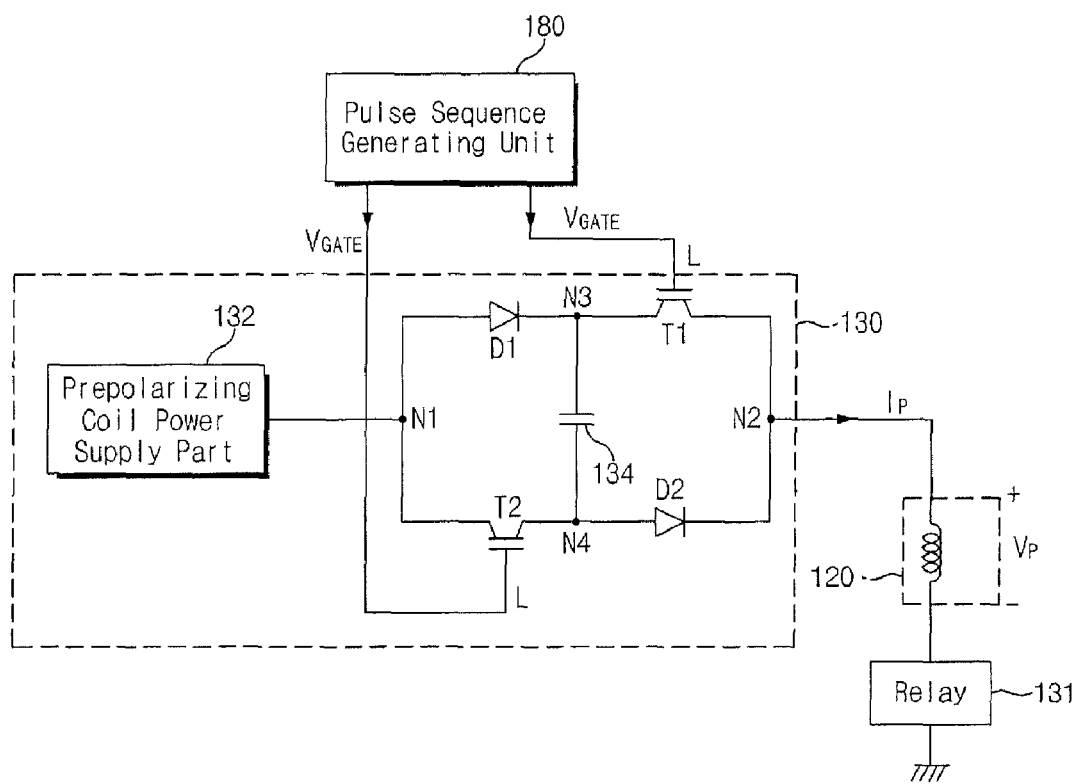
Figure 11:
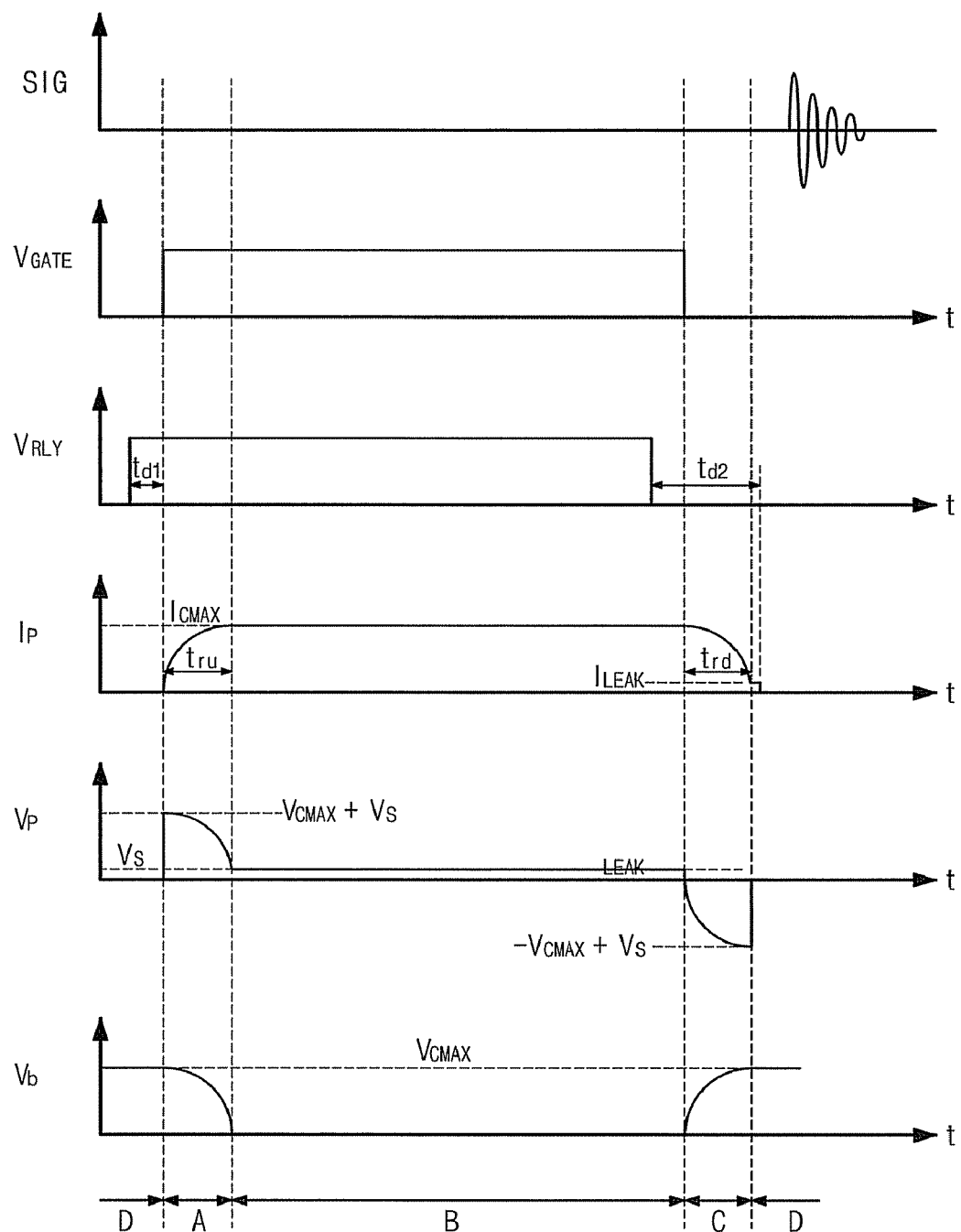
FIG. 11 is a timing diagram of a circuit shown in FIG. 6.

Referring to FIG. 10, when the capacitor bank 134 is fully charged, the current flowing through the prepolarization coil 120 becomes zero and the voltage $V_p$ on the prepolarization coil 120 reaches $-V_{CMAX}+V_s$ before the current flow stops and $V_p$ goes down to zero. Since the first and the second power transistors T1 and T2 are turned off, the voltage $V_p$ on the prepolarization coil 120 is zero and a high voltage $V_{CMAX}$ exists across the fully charged capacitor 134, both diodes D1 and D2 are reverse biased and block current from flowing through them. As a result, the prepolarization coil driving unit 130 provides no current to the prepolarization coil 130 any more except for small amount of leakage current flowing through the first and second power transistors T1 and T2 and the first and second diodes D1 and D2. The phase D in FIG. 11 corresponds to the state in FIG. 9.

FIG. 12 illustrates a configuration of capacitor bank in place of the capacitor 134 according to some embodiments of the present invention. As illustrated, the capacitor bank 134 includes a first sub-capacitor bank 40a including a first capacitor 41a and a first resistor 42a connected to in parallel to the first capacitor 41a. First sub-capacitor banks 40a and 40b are serially connected to constitute one of second sub-capacitor groups 43a, 43b, and 43c which are in turn connected in parallel to each other. The capacitor bank 134 has a higher voltage rating and can have lower, higher, or the same capacitance depending on its configuration. Resistance of the first resistor 42a needs to be small enough to be able to uniformly divide the voltage applied between first capacitors 41a and 41b connected in series and adjust for any voltage disturbances rapidly, while high enough so that the leakage current flowing through the resistor is small. The final voltage rating of the capacitor may be determined to have a value obtained by subtracting a safety margin, determined by the parallel resistors, from the sum of voltage ratings of first capacitors connected in series. The total capacitance $C_b$ may be calculated by the same manner as in serial-parallel connection of first capacitors as if the first resistors do not exist.

Figure 13:
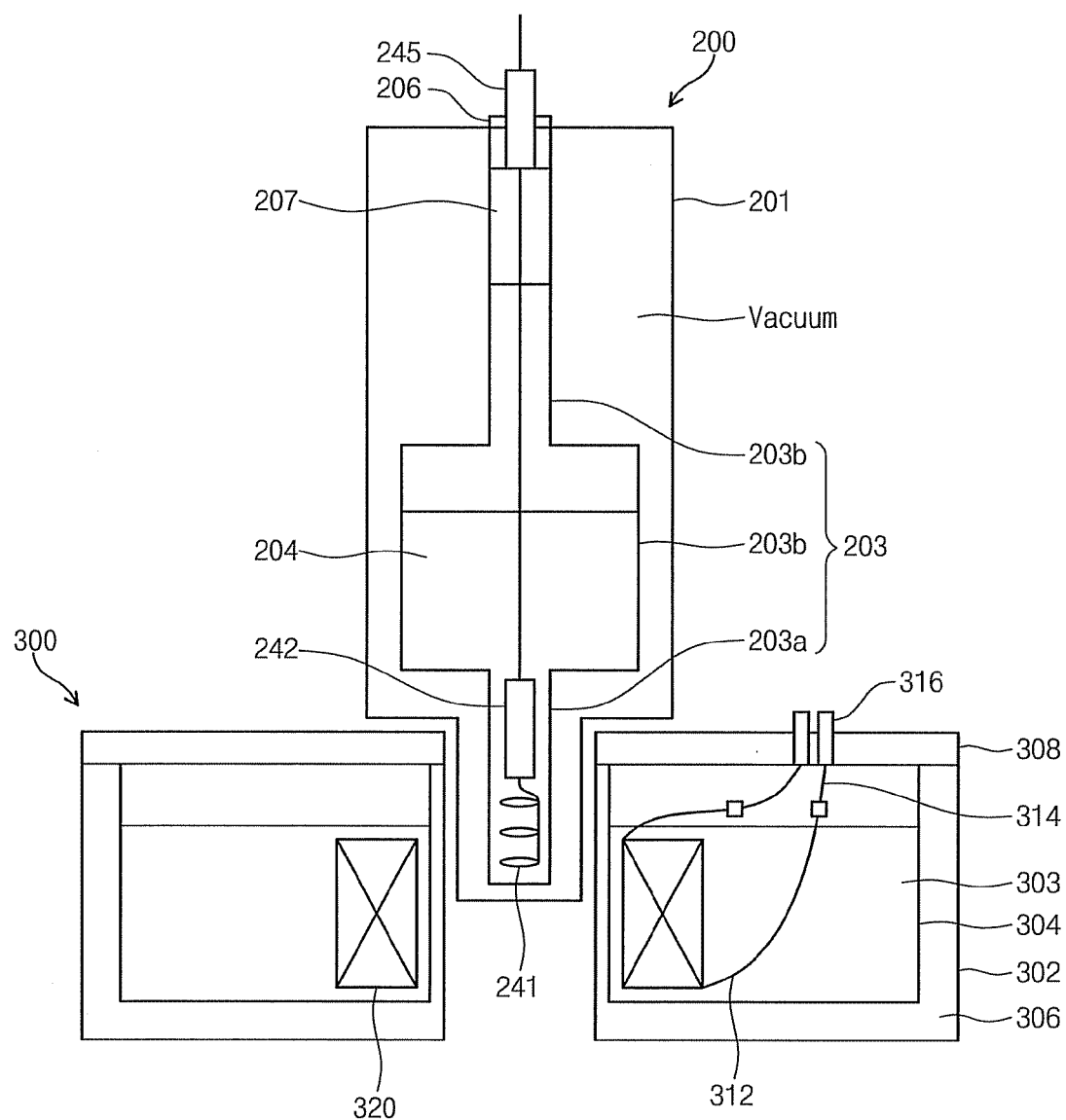
FIG. 13 illustrates a nuclear magnetic resonance apparatus according to other embodiments of the present invention.

FIG. 13 illustrates a nuclear magnetic resonance apparatus according to other embodiments of the present invention. Since the same elements as in FIGS. 1 and 2 are assigned with the same numerals, duplicate explanations will be omitted herein.

The nuclear magnetic resonance apparatus as described in FIG. 13 includes a first dewar 300 containing a low-temperature liquid refrigerant, a prepolarization coil 320 disposed inside the first dewar 300 and including a superconducting wire, a prepolarization coil driving unit (not shown) for intermittent application of current to the prepolarization coil 320 to generate a prepolarization magnetic field $B_p$, sensor units 241 and 242 for measuring the nuclear magnetic resonance signal from a sample (not shown) to which the prepolarization magnetic field $B_p$ is applied with the prepolarization coil 320, and a readout magnetic field generation unit (not shown) for applying a readout magnetic field to the sample. The prepolarization coil driving unit can be of capacitor charge/discharge type.

The first dewar 300 have a double-wall structure. The first dewar 300 can be a toroid in shape. The first dewar 300 includes an outer container 302 and an inner container 304 disposed inside the outer container 302. A space between the outer container 302 and the inner container 304 is in vacuum. The inner container 304 contains a low-temperature liquid refrigerant 303, which can be liquid nitrogen or liquid helium. The prepolarization coil 320 is disposed such that it is submerged into the low-temperature liquid refrigerant 303 inside the inner container 304. A first dewar lid 308 is disposed to span the connected portion of the inner container 304 and the outer container 302 and cover the inner container 304. Two first electrical connectors 316 are disposed in the dewar lid 308 and provide electrical connection into the prepolarization coil 320 disposed inside the inner container 304.

The prepolarization coil 320 is made of at least one of a superconductor and a resistive copper conductor. The prepolarization coil 320 takes the form a thick solenoid. A first wire 312 is connected to the prepolarization coil 320. A part of the first wire is submerged into the liquid refrigerant 303, and the other part thereof is exposed to the exterior. The first wire 312 is formed of a high-temperature superconductor in the case where the liquid refrigerant 303 is liquid helium. Otherwise, the first wire 312 is formed of a resistive copper conductor in form of a single wire, a stranded wire, or Litz-wire.

One end of a second wire 314 is connected to the first wire, and the other end thereof is connected to the first electrical connector 316. The second wire 314 is a resistive conductor that is in form of a single wire, a stranded wire or Litz-wire. The resistive conductor is copper.

One of the sensor units 241 is a flux transformer 241 for detecting and attenuating/amplifying the detected flux, and the other 242 a superconducting quantum interference device (SQUID) 242 for receiving the output of the flux transformer 241 to convert the received output signal to a voltage signal after detecting a magnetic field, a flux locked loop (FLL) part (not shown) for linearizing the voltage signal of the SQUID 242, a sensor signal processor (not shown) for processing the linearized voltage signal to reduce noise and amplify the processed signal, and a sensor controller (not shown) for providing a control signal to the FLL part.

The flux transformer 241 and the SQUID 242 are disposed inside a second dewar 200, which also have a double-wall structure. The second dewar 200 includes an outer container 201 and an inner container 203 disposed inside the outer container 201. The space between the outer container 201 and the inner container 203 is in vacuum. The inner container 203 can be divided into a first inner container 203a having a smaller external diameter, a second inner container 203b having a larger external diameter, and a third inner container 203c having a smaller external diameter. Each of the first, second, and third inner containers 203a, 203b, and 203c is a cylindrical container. The first, second and third inner containers 203a, 203b, and 203c share a central axis. The flux transformer 241 and the SQUID 242 are disposed inside the first inner container 203a. The inner container 203 contains the liquid refrigerant 204, usually liquid helium. A second dewar lid 206 is disposed on connected portion of the outer container 201 and the inner container 203. A second electrical connector 245 is disposed in the second dewar lid 206. The second electrical connector 245 is electrically connected to the SQUID 242. An insulating baffle 207 is disposed on the third inner container 203c.

As explained so far, a nuclear magnetic resonance apparatus according to some embodiments of the present invention use not a resistive wire but a superconducting wire for the prepolarization coil. A prepolarization coil made of the superconducting wire allows significantly larger amount of current to flow than that made of a resistive wire and reduce heating caused by current.

Since the prepolarization coil made of a superconducting wire is small in size and dissipates less heat, it can be cooled with liquid helium. Thus, the prepolarization coil can be integrated into a single dewar containing liquid helium with the SQUID sensor.

Moreover, the driving circuit for the prepolarization coil does not employ a simple current switching with avalanche breakdown-induced heat dissipation method. That is, the driving circuit of the prepolarization coil employs a method of charging the magnetic induction energy of the fully energized prepolarization coil into a capacitor or a capacitor bank, and then discharging the said capacitor or capacitor bank to energize the prepolarization coil back. It is therefore possible to minimize energy dissipation resulting from the changes in the intermittent current applied to the prepolarization coil and also to reduce current rising time. Accordingly, the capacitor charge/discharge method of magnetic induction energy is used to reduce time required for magnetizing imaging samples with the same intensity. The capacitor charge/discharge method of magnetic induction energy can efficiently utilize energy while minimizing energy dissipation resulting from current variation. Therefore, the prepolarization coil driving circuit can handle significantly increased amount of current safely.

Although the present invention has been described in regards to the embodiments of the present invention illustrated in the accompanying drawings, it is not limited thereto. It will be apparent to those skilled in the art that various substitutions, modifications and changes may be made without departing from the scope and spirit of the invention.

What is claimed is:

1. A nuclear magnetic resonance apparatus comprising:
a dewar containing a low-temperature liquid refrigerant;
a prepolarization coil disposed inside the dewar and including a superconducting wire;
a prepolarization coil driving unit for intermittent application of electrical current into the prepolarization coil to generate a prepolarization magnetic field, with the prepolarization coil driving unit being of capacitor charge/discharge type;
a sensor unit for detecting a nuclear magnetic resonance signal from an imaging sample to which a prepolarization magnetic field is applied with the prepolarization coil; and
a readout magnetic field generation unit for applying a readout magnetic field to the imaging sample.

2. The nuclear magnetic resonance apparatus as set forth in claim 1, further comprising:
a first wire connected to the prepolarization coil and made of a high-temperature superconductor partially submerged in the low-temperature liquid refrigerant; and
a second wire connected to the first wire at a portion that is not submerged in the low-temperature liquid refrigerant and connected to the prepolarization coil driving unit,
wherein the second wire is a resistive conductor that is in the form of a single wire, a stranded wire or Litz-wire.

3. The nuclear magnetic resonance apparatus as set forth in claim 2, wherein the superconducting wire includes a buffer layer, a high-temperature superconductor, a conductive protective layer, and a copper stabilizer layer that are sequentially stacked on a substrate material, the copper stabilizer layer being disposed to cover the buffer layer, the high-temperature superconductor, and the conductive protective layer.

4. The nuclear magnetic resonance apparatus as set forth in claim 1, wherein the superconducting wire includes:
a plurality of superconductor filaments spaced apart from each other; and
a matrix disposed to fill the space between the superconductor filaments, cover the superconductor filaments and provide a predetermined external diameter,
wherein the matrix includes at least one of copper and copper-alloy.

5. The nuclear magnetic resonance apparatus as set forth in claim 4, wherein the superconductor filament includes at least one of NbTi, $Nb_3Sn$, and $MgB_2$.

6. The nuclear magnetic resonance apparatus as set forth in claim 4, wherein the superconducting wire further includes a protective layer surrounding the matrix and having higher thermal conductivity than the matrix.

7. The nuclear magnetic resonance apparatus as set forth in claim 1, further comprising at least one of:
an excitation magnetic field generation unit for generating an excitation magnetic field;
a pulse sequence generation unit for providing a pulse sequence signal; and
a control unit for processing an output signal of the sensor unit and controlling the pulse sequence generation unit and the excitation magnetic field generation unit.

8. The nuclear magnetic resonance apparatus as set forth in claim 7, wherein the sensor unit includes at least one of a superconducting quantum interference device (SQUID) sensor, an atomic magnetometer sensor, and a magnetoresistance sensor.

9. The nuclear magnetic resonance apparatus as set forth in claim 7, wherein the sensor unit comprises:
a SQUID sensor; and
a flux transformer for sensing and/or attenuating/amplifying a flux attached to the SQUID sensor,
wherein the sensor unit is submerged in the low-temperature liquid refrigerant in the dewar.

10. The nuclear magnetic resonance apparatus as set forth in claim 7, wherein the sensor unit comprises:
a SQUID sensor; and
a flux transformer for sensing and/or attenuating/amplifying a flux attached to the SQUID sensor,
wherein the dewar includes a first dewar and a second dewar which are isolated from each other;

wherein the sensor unit is disposed inside the second dewar submerged in the low-temperature liquid refrigerant contained therein; and the prepolarization coil is disposed in the first dewar.

11. The nuclear magnetic resonance apparatus as set forth in claim 1, wherein the prepolarization coil driving unit includes:

a first diode connected to a first terminal;

a first power transistor having one end connected in series to the first diode and the other end connected to a second terminal;

a second power transistor connected to the first terminal;

a second diode having one end connected in series to the second power transistor and the other end connected to the second terminal; and a capacitor or a capacitor bank disposed between a third terminal between the first diode and the first power transistor and a fourth terminal between the second terminal and the second power transistor, wherein the prepolarization coil is connected to the second terminal.

12. The nuclear magnetic resonance apparatus as set forth in claim 11, further comprising:

a mechanical relay connected in series to the prepolarization coil, wherein the relay blocks leakage current from flowing to the prepolarization coil when the first and second power transistors remain in an OFF state and the capacitor or the capacitor bank remains in a charged state.

13. The nuclear magnetic resonance apparatus as set forth in claim 11, wherein each of the first and second transistors is an insulated-gate bipolar transistor (IGBT).

14. A nuclear magnetic resonance apparatus comprising:

a dewar containing a low-temperature liquid refrigerant;

a prepolarization coil disposed inside or surrounding the dewar;

a prepolarization coil driving unit for intermittently applying current to the prepolarization coil to generate a prepolarization magnetic field, with the prepolarization coil driving unit being of capacitor charge-discharge type;

a sensor unit for detecting a nuclear resonance signal from an imaging sample to which a prepolarizing magnetic field is applied by the prepolarization coil; and a readout magnetic field generation unit for applying a readout magnetic field to the imaging sample.

15. The nuclear magnetic resonance apparatus as set forth in claim 14, wherein the prepolarization coil driving unit includes:

a first diode connected to a first terminal;

a first power transistor having one end connected in series to the first diode and the other end connected to a second terminal;

a second power transistor connected to the first terminal;

a second diode having one end connected in series to the second power transistor and the other end connected to the second terminal; and a capacitor or a capacitor bank disposed between a third terminal between the first diode and the first power transistor and a fourth terminal between the second terminal and the second power transistor, wherein the prepolarization coil is connected to the second terminal.

16. The nuclear magnetic resonance apparatus as set forth in claim 15, further comprising:

a mechanical relay connected in series to the prepolarization coil, wherein the relay blocks leakage current from flowing to the prepolarization coil when the first and second power transistors remain in an OFF state and the capacitor or the capacitor bank remains in a charged state.

17. The nuclear magnetic resonance apparatus as set forth in claim 15, wherein each of the first and second transistors is an insulated-gate bipolar transistor (IGBT).

* * * * *